United States Patent
Whitney et al.

(10) Patent No.: US 6,459,710 B1
(45) Date of Patent: Oct. 1, 2002

(54) REFLECTOR FOR DIRECTING FRONT FACET LIGHT TO MONITOR DIODE

(75) Inventors: Peter S. Whitney; Mark E. Kuznetsov, both of Lexington; Steven C. Fawcett, Stoneham; Mark R. Malonson, Merrimac, all of MA (US)

(73) Assignee: Axsun Technologies, Inc., Billerica, MA (US)

( * ) Notice: Subject to any disclaimer, the term of this patent is extended or adjusted under 35 U.S.C. 154(b) by 49 days.

(21) Appl. No.: 09/707,714

(22) Filed: Nov. 7, 2000

(51) Int. Cl.[7] .................................................. H01S 3/13
(52) U.S. Cl. .............................. 372/29.02; 372/29.021; 372/36; 385/92
(58) Field of Search ............................... 385/92; 372/6, 372/99, 102, 29.021, 29.02, 36

(56) References Cited

U.S. PATENT DOCUMENTS

| | | | |
|---|---|---|---|
| 3,698,789 A | * 10/1972 | Wolber | 359/197 |
| 4,844,581 A | 7/1989 | Turner | 350/96.2 |
| 4,945,391 A | 7/1990 | Yagoura et al. | 357/19 |
| 5,245,620 A | 9/1993 | Tanaka et al. | 372/36 |
| 5,631,987 A | 5/1997 | Lasky et al. | 385/88 |
| 5,812,715 A | 9/1998 | Tiemeijer et al. | 385/73 |
| 5,920,585 A | 7/1999 | Kim et al. | 372/43 |
| 6,094,515 A | * 7/2000 | Miki et al. | 385/31 |
| 6,243,517 B1 | * 6/2001 | Deacon | 372/102 |
| 6,345,059 B1 | * 2/2002 | Flanders | 372/19 |

FOREIGN PATENT DOCUMENTS

| | | | |
|---|---|---|---|
| JP | 09312407 | 12/1997 | H01L/31/232 |
| WO | 91/07788 | 5/1991 | H01S/3/18 |

* cited by examiner

*Primary Examiner*—Robert H. Kim
*Assistant Examiner*—George Wang
(74) *Attorney, Agent, or Firm*—Grant Houston

(57) ABSTRACT

A semiconductor laser system includes a reflector on the lid that directs light emitted from the front facet to the monitoring diode. Thus, even when the diode is installed behind the semiconductor laser chip, and as a result receives back facet light, the ratio of front facet to back facet light received by the monitoring diode is increased due to the operation of the reflector. This configuration improves power tracking in Bragg grating stabilized semiconductor laser systems, for example.

28 Claims, 4 Drawing Sheets

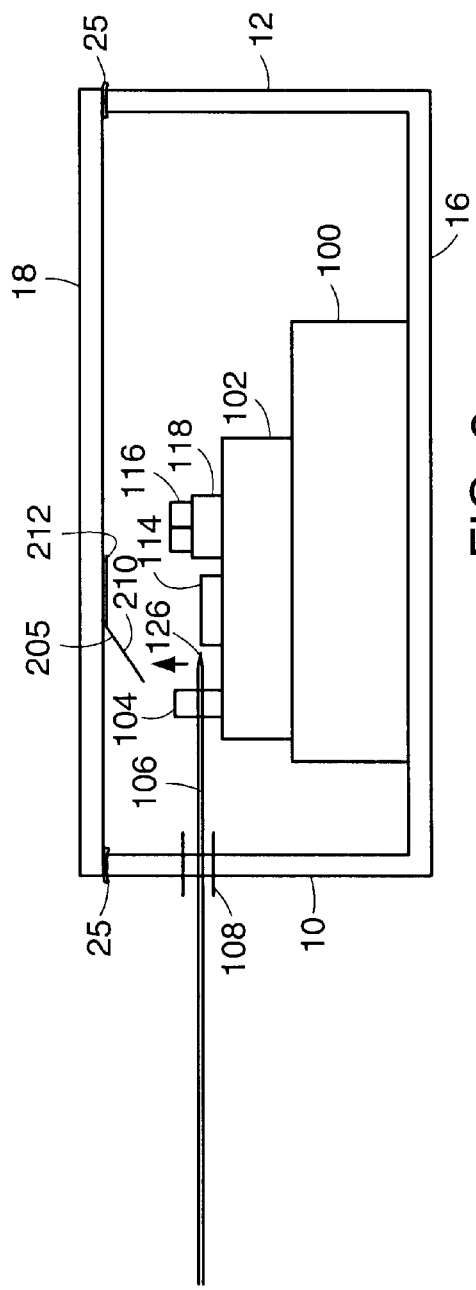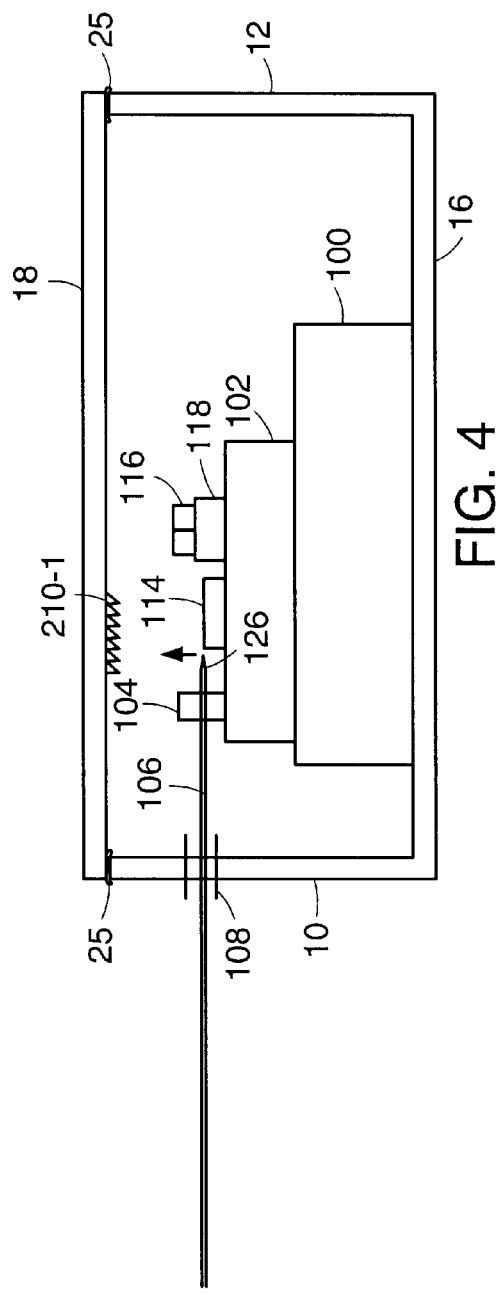

REFLECTOR FOR DIRECTING FRONT FACET LIGHT TO MONITOR DIODE

BACKGROUND OF THE INVENTION

Monitor diodes are used for output power control in semiconductor laser systems. They typically detect a portion of the light generated by the semiconductor laser and provide a corresponding signal to a control loop. The control loop then usually modulates the injection current level to the semiconductor laser chip to thereby modulate its output power.

Monitor diodes are relevant both to semiconductor pump lasers and semiconductor transmitter lasers. Transmitters are typically modulated either directly or have their cw output carrier modulated with a separate modulator such as a Mach-Zender interferometer. In contrast, pump lasers are used to optically excite a fiber gain medium in a fiber amplification system or other optically pumped gain medium.

In fact, pump lasers are one of the most common semiconductor laser devices in contemporary carrier-class systems. They are typically high power, edge-emitting device that pump either rare earth-doped gain fiber, such as erbium doped fiber, or regular fiber in a Raman pumping scheme. The output light levels can be critical, especially when trying to control gain tilt in rare earth-doped fiber systems or polarization balancing in Raman pumping. Further, the level of amplification and thus, pump light, are critical in optical add/drop devices to minimize or avoid the need for active optical attenuation devices.

Historically, the monitor diodes were positioned in the pump package to detect light exiting from the back facet. Back facets of semiconductor lasers are coated to have very high reflectivity. Nonetheless, some light still exits or leaks through the back facet and the level of this light can be used as a proxy for the level of light exiting though the front facet.

More recently, however, fiber Bragg grating stabilization has been required in main laser pump systems. This stabilization is required in many high capacity, dense wavelength division multiplexed DWDM systems to minimize pump mode-hopping noise in the amplified signals. In Raman pumping schemes, fiber Bragg grating stabilization is useful both to broaden the spectrum of light generated by the pump laser and to also promote polarization stability in the light from the pump lasers.

The dynamics of the system created by a fiber Bragg grating pump laser is somewhat more complex than the typical laser pump. Specifically, it has an external laser cavity defined by the distance from the semiconductor laser's back facet to the fiber grating. This external cavity overlaps the cavity defined by the front and rear facets of the semiconductor device. The result is that the device has somewhat more complex operating characteristics. Specifically, in the context of monitoring diodes, many times the correspondence between the level of light exiting from the back and front facets may not always be stable with time and temperature. As a result, when the power control signal is derived solely from back facet light, the power stability of the pump lasers over time and ambient temperature is degraded More recently, some pump lasers have used monitoring diodes that are oriented within the package to be more responsive to scattered or ambient light within the package. Specifically, they are installed flat on the submount so that their active areas are directed toward the package lid. As a result, the control signal generated by the monitoring diode is derived at least, in part, by scattered light in the package that originates from the front facet. This can improve their stability.

SUMMARY OF THE INVENTION

Experiments suggest that, even with the monitoring diode directed toward the package lid, the degree to which the monitoring diode's signal tracks the output light is still suboptimal. This is due to the fact that the monitoring diode is still located behind the pump laser in a position to receive some back facet light and the orientation of the monitoring diode in combination with the optical absorption and charge migration characteristics of the typically silicon photodiodes still results in the photodiode being responsive, in large part, to back facet light.

The present invention is directed to a semiconductor laser system. Specifically, it includes a reflector on the lid that directs light emitted from the front facet to the monitoring diode. Thus, even when the diode is installed behind the semiconductor laser chip, and as a result receives back facet light, the ratio of front facet to back facet light received by the monitoring diode is increased due to the operation of the reflector.

In general, according to one aspect, the invention features a semiconductor laser system. It includes a sealed package including a lid, a floor, and sidewalls, which extend between the lid and floor. An edge-emitting semiconductor stripe laser chip is installed within the package. An optical fiber extends into the package via a feedthrough in one of the sidewalls. The optical fiber has an endface that is installed within the package, such that light is coupled between the chip and the endface through a front facet of the semiconductor chip. A monitoring diode is further installed within the package. Finally, according to the invention, a reflector is located on the lid, which reflector comprises a reflecting surface that is angled with respect to the plane of the lid to direct light emitted from the front facet to the monitoring diode either directly or indirectly.

The present invention is applicable regardless of the type of package used and thus can be applied to butterfly packages or dual in-line pin (DIP) packages, for example. Further, it can be applied to 980 or 1480 nanometer (nm) erbium fiber pumps or the 1300 to 1600 nm (14xx nm) pumps used in Raman amplification. Normally, however, it is most applicable to Bragg grating stabilized lasers where tracking, based upon back facet light alone, is generally poor.

The present invention is most effective when fiber lenses are used to improve the coupling efficiency between the fiber endface and the semiconductor laser chip. Specifically, in the case of wedge-shaped and/or double angle wedge-shaped, cylindrical, quasi-cylindrical, or other aspheric fiber lenses, a substantial surface of the endface slopes obliquely toward the lid in a direction moving away from the laser chip. The angling results in light being directed toward the lid of the package, when it is not captured by the fiber lens/coupled into the fiber core. Specifically, according to the invention, a reflector on the lid, above the endface, is used to direct light to a photodiode installed behind the semiconductor chip.

The installation of the diode behind the chip along the device's medial line is a preferred configuration for a number of engineering factors. Another place to install the monitoring diode is underneath the fiber in front of the chip or to a side of the chip. Physical conflicts with the installation of the fiber in the package typically need to be resolved, however. Further non-medial locations can be used. Typically, however, the medial configuration is desirable because of the emission characteristics of edge-emitting lasers, and how they distribute the non-coupled light in the package. Nonetheless, it should be noted that with the use of the reflector configuration, alternative configurations can be used without degrading performance.

According to one embodiment of the invention, the reflector comprises essentially a single reflecting surface that extends obliquely down from the lid and can be a specular or diffuse reflector.

In another embodiment, a Fresnel-type reflector is used that comprises a series of shorter reflecting surfaces. Such a Fresnel reflector can be attached to the lid, etched into it, or scored into the lid. In a further embodiment, a standard or blaze-type grating can be used.

In still a further embodiment, the photodiode can be installed on a pedestal, such that its active surface is located substantially above the top of the semiconductor chip. As a result, this orientation further diminishes the amount of back facet light detected by the monitoring diode.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of the invention may be employed in various and numerous embodiments without departing from scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 3 is a side elevation cross-sectional view of the package with lid reflector, according to the present invention; and FIG. 4 is a side elevation cross-sectional view showing a second embodiment of the inventive lid reflector;

DETAILED DESCRIPTION OF THE PREFERRED EMBODIMENTS

Figure 1:
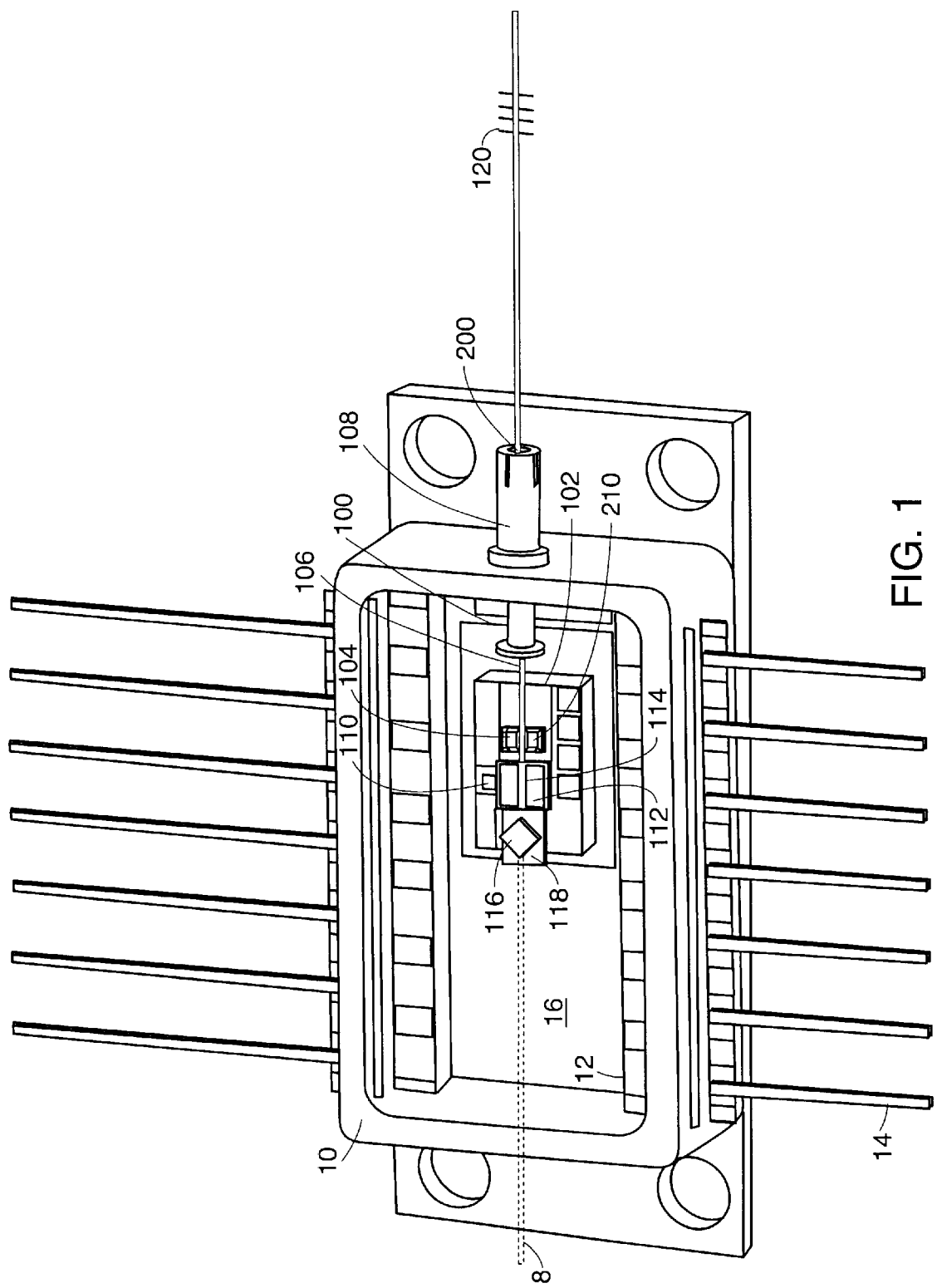
FIG. 1 is a perspective view of a semiconductor laser system according to the present invention, with the lid cut away.

FIG. 1 shows a semiconductor laser system, which has been constructed according to the principles of the present invention.

Specifically, the system comprises a package 10. In the illustrated example, a butterfly package is used in which leads 14 extend laterally from the package. In other implementations, the invention can also be applied to DIP packages where the leads 14 extend orthogonally from the floor 16 of the package 10.

In the illustrated cooled laser system, a thermo-electric cooler 100 is installed on the floor 16 of the package 10. These coolers are typically driven in response to the temperature within the package, detected by thermistor 110 for example, to maintain a temperature-stable operating environment for the semiconductor laser chip.

A bench or submount 102 is secured to the cooler 100. In the preferred embodiment, the bench is constructed from a mechanically and temperature stable substance, such as aluminum nitride, silicon, silicon-metal composite, silicon oxide, or beryllium oxide in various implementations.

Semiconductor laser chip 114 is connected to the bench 102. The chip is an edge-emitting semiconductor chip as are used in carrier-class pump lasers, for example. It generates light preferably at about 980 or 1480 nm, where there are absorption peaks in erbium-doped fiber. Alternatively, it generates light in the range of 1300 to 1600 nm, i.e., 14xx, in case of a Raman pumping scheme. The chip laser stripe defines a medial line 8 of the system.

In more detail, the chip 114 bonded to a substrate 112 with a bond pad 113 (see FIG. 2) to form a chip hybrid. This chip hybrid is then preferably solder-bonded to the bench 102. A monitoring diode 116 is installed on the bench 102 behind a back facet 128 (see FIG. 2) of the chip 114. Specifically, the monitoring diode 116 is installed on a pedestal structure 118, which is similarly solder-bonded to the bench 102.

In the preferred embodiment, the diode 116 is laid-down on the bench 102. That is, the active surface 122 (see FIG. 2) of the monitoring diode 116 is in a plane that is parallel or substantially parallel to the surface of the bench 102. Further, the monitoring diode is oriented rotationally with respect to the semiconductor chip's back facet 128 so that the level of light that is received from the back facet is minimized. Specifically, in a current implementation, the sides of the photodiode are rotated or angled about an axis that is orthogonal to the plane of the bench such that a plane defined by a sidewall of the photodiode forms a 45 degree angle with a plane defined by the back facet of the semiconductor chip 114.

In one implementation, the diode 116 is a silicon diode. This material system is common for 980 nm pump device diodes. Alternatively, in the case of a 1300–1500 nm devices such as 1480 or 14xx pumps, a direct gap (III–V) material system such as InGaAs is preferred. One advantage with the present invention in this later configuration surrounds the fact that horizontal orientations are generally incompatible with InGaAs diodes because the substrates are not absorbing at these wavelengths. Thus, there will be little photodetector response due to back facet light striking the side of the diode, necessitating the reflector system in the case of horizontal diode installation of InGaAs diodes. Moreover, in the case of the present invention, this effect is yields advantages associate with the fact that the diode can be installed horizontally behind the diode and yet be responsive almost entirely to front facet light.

An optical fiber pigtail 106 enters the package 10 through a fiber feedthrough in which a ferrule 108, having an end 200, is installed. The endface of the fiber pigtail is secured to the bench 102 in proximity to the front facet of the semiconductor chip 114. Specifically, in the preferred embodiment, a deformable fiber mounting structure 104 is used so that the endface is held in a stable yet adjustable relationship to the semiconductor laser front facet.

As stated previously, the present invention has particular applicability to pump lasers incorporating Bragg grating stabilization. Specifically, in one implementation, the fiber pigtail 106 comprises a Bragg grating 120 that is formed in the fiber pigtail.

Figure 2:
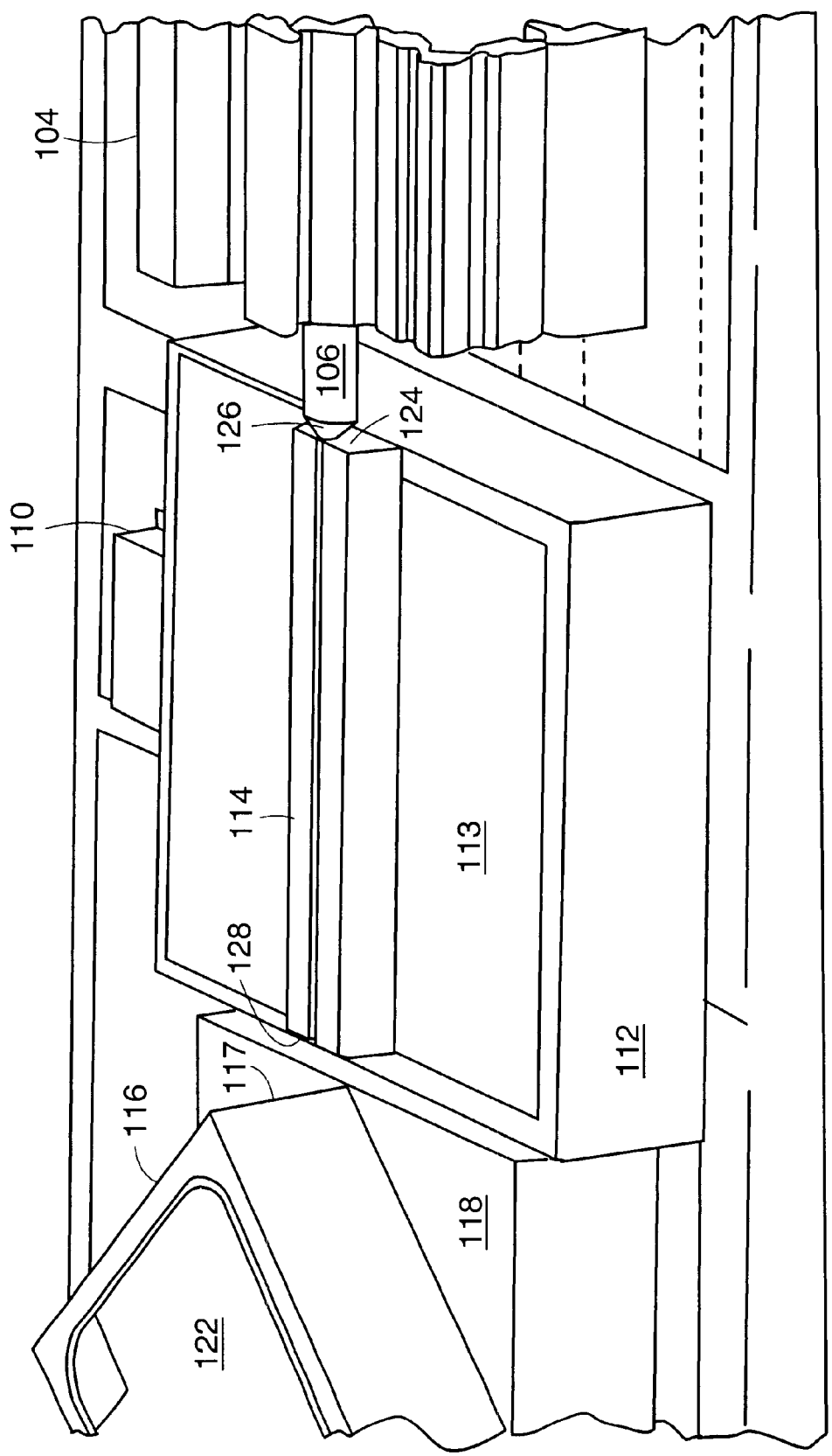
FIG. 2 is a close up perspective view of the semiconductor laser chip, showing the fiber endface, chip facets, and the monitoring diode configured according to the principles of the present invention.

FIG. 2 shows the details of the orientation of the semiconductor laser chip 114, the monitoring diode 116 and the fiber endface 126. Specifically, the lensed fiber endface 126 is located in line with the stripe of the semiconductor chip 114 opposite the chip's front facet 124.

Fiber lens coupling system typically yield good coupling efficiencies of on the order of 70 to 80% in which the light that is emitted from the front facet 124 is coupled to propagate in the fiber pigtail 106. Even with such coupling efficiencies, 20% of the light is not coupled into the fiber. Contemporary laser chips produce 200 milliWatts of power, yielding 40 milliWatts of optical power to be dissipated or detected in the package. Further, in most pumps chips, emitted light is diverging more quickly in the vertical directions than horizontally. Thus, substantial light is available above the fiber endface for redirection to the detector.

Turning to the monitoring diode 116, a corner 117 of the monitoring diode is aligned to point at the back facet 128 of the chip 114. Further, the active area 122 of the monitoring diode 116 is positioned above a plane of the top surface of the chip. This further reduces the degree to which the monitoring diode is electrically responsive to the back facet. Specifically, in the illustrated example, the monitoring diode 116 is installed on a pedestal 118 so that it "sits" above the chip 114.

In an alternative embodiment, a thinner photodiode is used in combination with no pedestal. In this case, the top, active surface 122 of the diode 116 is located below the elevation of the back facet 128 of diode 114. Experiments suggest that this configuration is equally effective at reducing the back facet light detected by the diode.

FIG. 3 shows one embodiment of the lid reflector 205 according to the present invention. As described previously, the package 10 comprises sidewalls 12 and floor 16. As part of manufacturing, a lid 18 is installed to hermetically seal the package 10. Specifically, the lid is welded or soldered to the top of sidewalls 12 via bond 25. This is typically accomplished in devices called lid sealers that arc weld the lid 18 to the sidewalls 12.

The lid reflector has a generally dogleg configuration, comprising a substantially unitary reflecting surface 210 and a flat section 212 that is bonded to the lid 18. The angled reflecting surface 210 is angled so that light indicated by the arrow that is reflected from one of the surfaces of the wedge fiber endface lens 126 is reflected toward the monitoring diode 116.

FIG. 4 illustrates a second embodiment in which a Fresnel-type reflector 210-1 is used. Instead of comprising a substantially single reflector surface as shown in FIG. 3, the Fresnel-type reflector 210-1 comprises a number of, for example, 10 or more separate reflecting surfaces, each one angled to direct the light reflected by the endface lens to the monitoring diode 116.

In one embodiment, this composite or Fresnel-type reflector is attached to the lid, such as via solder-bonding. In alternative embodiments, it is etched into the lid such as using a photolithographic process.

In a related configuration, the reflector 210-1 is implemented as a grating. Such gratings, depending on their spatial period, reflect light is defined modes. In still another embodiment, a blaze grating is used that directs light into a favored mode to increase the signal detected by the diode over a standard grating configuration. Such gratings are scored into the lid using a die-type process or other machining, for example.

Figure 5:
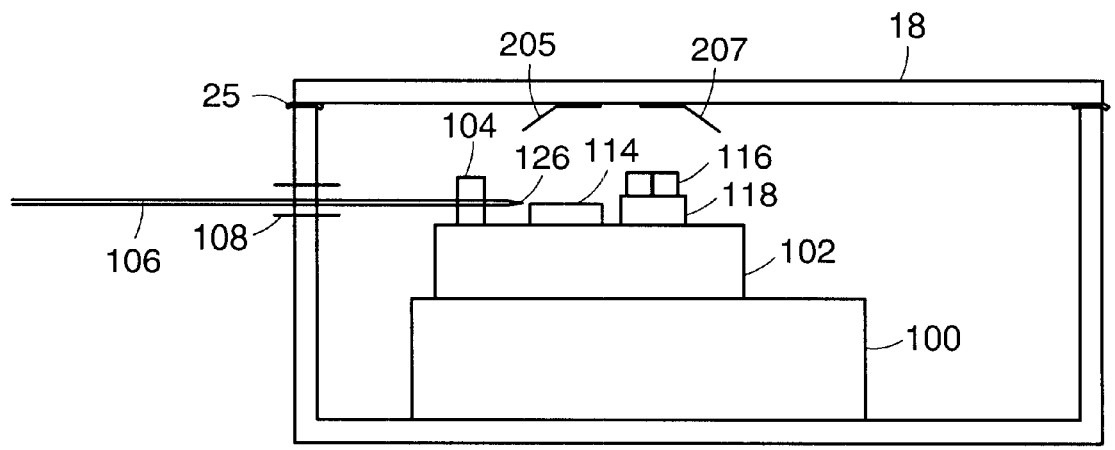
FIG. 5 is a side elevation cross-sectional view showing a third embodiment of the inventive lid reflector incorporating two discrete reflectors.

FIG. 5 shows a serial reflector configuration in which reflector 205 directs the light from the chip 114 and endface 126 horizontally or substantially horizontally to the lid 18 to a second reflector 207 that redirects the light vertically down to the diode 116. This configuration and related two reflector configurations enable the diode to be located almost anywhere in the package.

Figure 6:
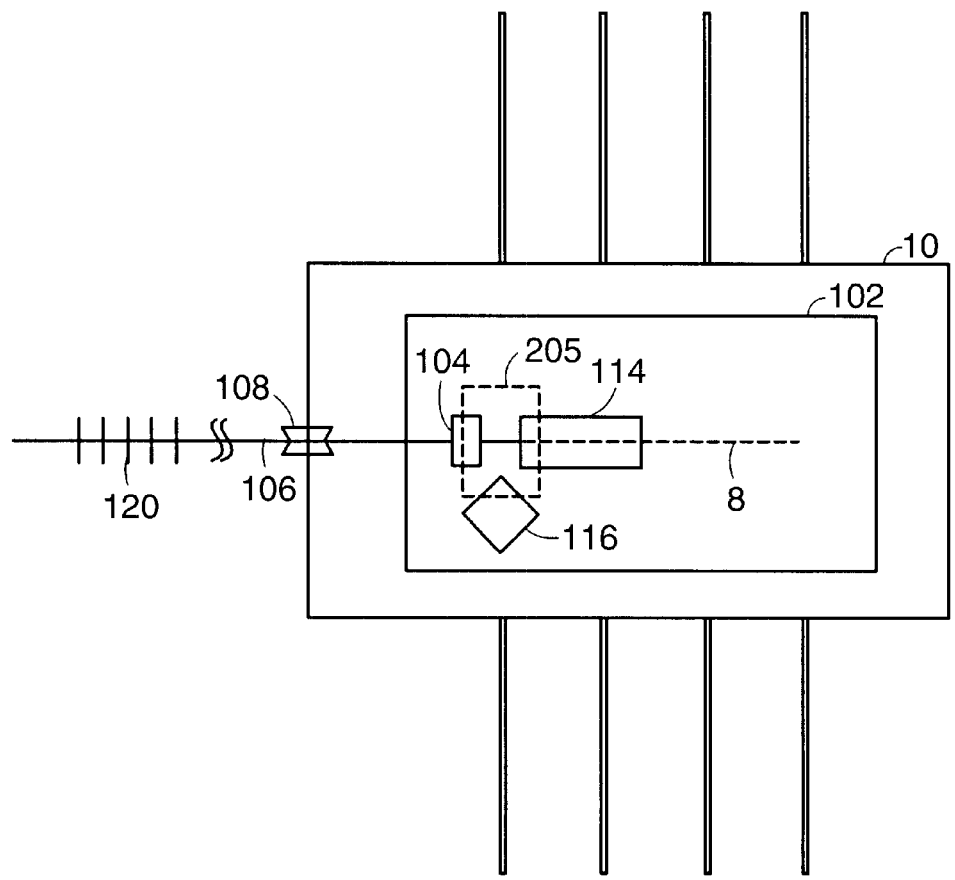
FIG. 6 is a top plan view showing another non-medial diode configuration according to the present invention.

FIG. 6 shows non-medial diode configuration in which a reflector 205 is angled to directed the light off the medial line 8 of the device. In the illustrated configuration the diode 116 is off to one side of the chip 114.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor laser system comprising:
   a sealed package including a lid, a floor, and sidewalls, which extend between the lid and the floor;
   an edge-emitting semiconductor chip installed within the package, the chip including a front facet;
   an optical fiber that extends into the package via a feedthrough in one of the sidewalls, the optical fiber having an endface that is installed within the package such that light is coupled between the chip and the endface through the front facet;
   a monitor diode installed within the package; and
   a reflector on the lid, comprising a reflector surface that is angled with respect to a plane of the lid to direct light transmitted from the front facet to the monitor diode.

2. A semiconductor laser system as claimed in claim 1, wherein the package is a butterfly package.

3. A semiconductor laser system as claimed in claim 1, wherein the package is a dual inline pin package.

4. A semiconductor laser system as claimed in claim 1, wherein the semiconductor chip generates light at approximately 980 nm.

5. A semiconductor laser system as claimed in claim 1, wherein the semiconductor chip generates light at approximately 1480 nm.

6. A semiconductor laser system as claimed in claim 1, wherein the semiconductor chip generates light in the range of 1300 to 1600 nm.

7. A semiconductor laser system as claimed in claim 1, wherein the endface of the optical fiber is a wedge shape.

8. A semiconductor laser system as claimed in claim 1, wherein the endface of the optical fiber is an aspheric shape.

9. A semiconductor laser system as claimed in claim 1, wherein the endface of the optical fiber comprises a surface that slopes obliquely toward the lid in a direction away from the semiconductor chip.

10. A semiconductor laser system as claimed in claim 1, wherein the optical fiber comprises a fiber grating that provides feedback to the semiconductor chip.

11. A semiconductor laser system as claimed in claim 1, wherein the optical fiber provides feedback to the semiconductor chip to thereby degrade a dependency between a magnitude of light emitted from the front facet relative to a magnitude of light emitted from a back facet.

12. A semiconductor laser system as claimed in claim 1, wherein the monitor diode is installed on a submount along a medial line defined by a semiconductor chip.

13. A semiconductor laser system as claimed in claim 1, wherein the monitor diode is installed on a submount behind the semiconductor chip.

14. A semiconductor laser system as claimed in claim 1, wherein the monitor diode is installed on a submount in front of the semiconductor chip and underneath the optical fiber.

15. A semiconductor laser system as claimed in claim 1, wherein the monitor diode is installed horizontally on a submount.

16. A semiconductor laser system as claimed in claim 1, wherein the reflector is a diffuse reflector.

17. A semiconductor laser system as claimed in claim 1, wherein the reflector comprises substantially a single reflector surface that extends obliquely down from the lid.

18. A semiconductor laser system as claimed in claim 1, wherein the reflector comprises a Fresnel reflector.

19. A semiconductor laser system as claimed in claim 1, wherein the reflector comprises a Fresnel reflector etched into the lid.

20. A semiconductor laser system as claimed in claim 1, wherein the reflector comprises a Fresnel reflector scored into the lid.

21. A semiconductor laser system as claimed in claim 1, wherein the reflector comprises a grating on the lid.

22. A semiconductor laser system as claimed in claim 21, wherein the grating is a blaze grating.

23. A semiconductor laser system as claimed in claim 1, wherein the monitor diode is installed on a pedestal, which is installed on a submount with the semiconductor chip.

24. A semiconductor laser system as claimed in claim 1, wherein elevation of a top of the semiconductor chip above the submount is less than a top of the monitor diode.

25. A semiconductor laser system as claimed in claim 1, wherein elevation of a top of the semiconductor chip above the submount is greater than a top of the monitor diode.

26. A semiconductor laser system as claimed in claim 1, further comprising a second reflector that receives light from the first reflector and directs the light to the monitor diode.

27. A semiconductor laser system comprising:
   a sealed package including a lid, a floor, and sidewalls, which extend between the lid and the floor;
   an edge-emitting semiconductor chip installed within the package, the chip including a front facet;
   an optical fiber that extends into the package via a feedthrough in one of the sidewalls, the optical fiber having an endface that is installed within the package such that light is coupled between the chip and the endface through the front facet;
   a monitor diode installed within the package; and
   a reflector on the lid comprising a grating for directing light transmitted from the front facet to the monitor diode.

28. A semiconductor laser system comprising:
   a sealed package including a lid, a floor, and sidewalls, which extend between the lid and the floor;
   an edge-emitting semiconductor chip installed within the package, the chip including a front facet;
   an optical fiber that extends into the package via a feedthrough in one of the sidewalls, the optical fiber having an endface that is installed within the package such that light is coupled between the chip and the endface through the front facet;
   a monitor diode installed within the package; and
   a first reflector on the lid, comprising a reflector surface that is angled with respect to a plane of the lid;
   a second reflector that receives reflected light from the first reflector, which originated from the front facet, and directs the light to the monitor diode.

* * * * *